Figure 1:
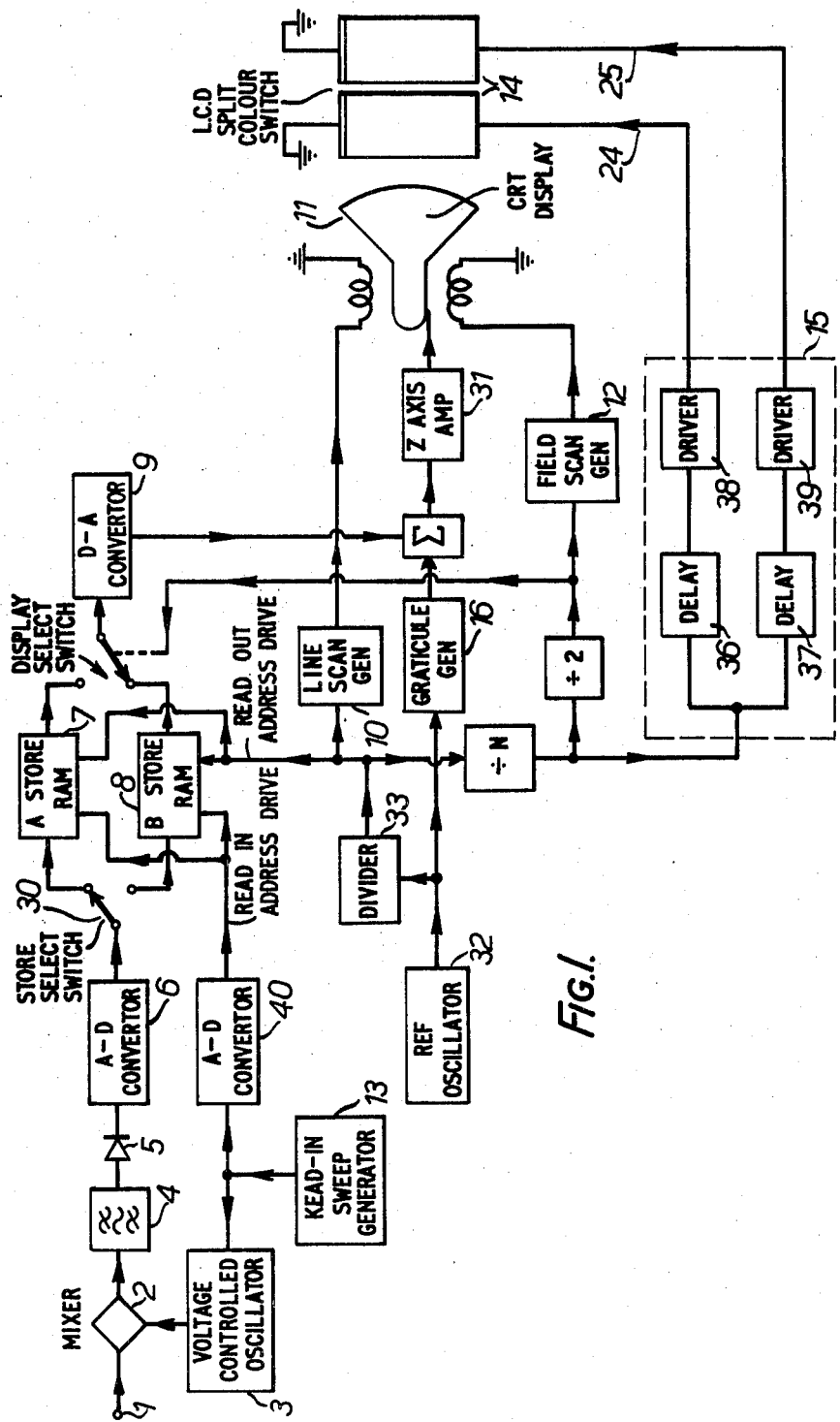

United States Patent [19]
Middleton

[11] 4,295,093
[45] Oct. 13, 1981

[54] SPECTRUM ANALYSERS

[75] Inventor: John D. Middleton, Welwyn, England

[73] Assignee: Marconi Instruments Limited, Chelmsford, England

[21] Appl. No.: 95,098

[22] Filed: Nov. 16, 1979

[30] Foreign Application Priority Data

Nov. 17, 1978 [GB] United Kingdom ............... 44927/78

[51] Int. Cl.$^3$ ............................................. G01R 23/16
[52] U.S. Cl. ................................ 324/77 B; 324/77 K; 340/702; 340/716
[58] Field of Search ............... 324/77 B, 77 K, 121 R, 324/115; 340/702, 716

[56] References Cited

U.S. PATENT DOCUMENTS

| | | | |
|---|---|---|---|
| 3,509,453 | 4/1970 | Wilmotte | 324/77 K |
| 4,117,480 | 9/1978 | Boario | 324/77 K |
| 4,198,634 | 4/1980 | Jernigan | 324/77 K |

*Primary Examiner*—Michael J. Tokar
*Attorney, Agent, or Firm*—Spencer & Kaye

[57] ABSTRACT

A spectrum analyser uses a monochrome cathode ray tube to display frequency information. A color swtich incorporating a layer of liquid crystal material and colored polarized dichroic plates is positioned in front of the display screen of the cathode ray tube and by operating the color switch in an appropriate manner a colored display is produced.

4 Claims, 2 Drawing Figures

SPECTRUM ANALYSERS

This invention relates to spectrum analysers. A spectrum analyser is an instrument which indicates which frequency components are present in an input signal applied to it, and it usually incorporates a visual display screen on which the relative amplitudes of the different frequency components are displayed. The display is required to be of small size but high resolution, and hitherto has sometimes consisted of a cathode ray tube in which the screen is scanned by an electron beam in a television type raster pattern to produce a monochrome picture. Although the use of a colour display would be advantageous, the use of small conventional colour cathode ray tubes having a shadow mask is not acceptable, since the resolution obtainable is much too coarse for this particular application.

The present invention seeks to provide a spectrum analyser having a colour display which does not suffer from this disadvantage.

According to this invention a spectrum analyser includes a monochrome cathode ray tube utilising a raster scanning pattern in which the lines of the raster are representative of different frequency components; a liquid crystal colour switch positioned immediately in front of the screen of the cathode ray tube and containing a thin film of liquid crystal material and two coloured polarised sheets, and selection means for selectively controlling the optical properties of the film so as to produce a display consisting of at least the two colours of said polarised sheets, and means for synchronising the operation of said selection means with the raster scanning pattern of the cathode ray tube.

Preferably the spectrum analyser includes two stores each containing data relating to the amplitude of frequency components, and means for causing data derived from one store to be displayed, in one of said two colours, and for causing data derived from the other store to be displayed in the other of said two colours.

In practice the contents of one store may be obtained from one signal source, and the contents of the other store may be obtained from another signal source which is to be compared with the other source, or alternatively the contents of the other stores may be obtained from the same signal source but obtained at different times so that changes in the frequency components of the signal source can be determined.

Preferably means are provided for controlling separately two contiguous regions of the thin film of liquid crystal material. In this way one region of the thin film can be switched from a first optical state to a second optical state whilst the other region is transmitting light from the portion of the screen of the cathode ray tube which is being scanned by its electron beam. The liquid crystal material changes its state relatively slowly, and by dividing it into two contiguous regions, undesirable delay in switching the viewed display from one colour to another is avoided.

Preferably again the two contiguous regions pass light corresponding to equal areas of the screen of the cathode may tube, with the line separating the two contiguous regions being substantially parallel to the line scanning direction of the raster scanning pattern.

Figure 2:
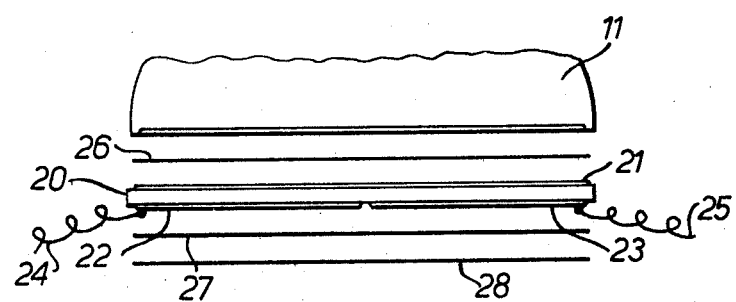

The invention is further described by way of example with reference to the accompanying drawings in which, FIG. 1 illustrates a spectrum analyser in accordance with the present invention and FIG. 2 illustrates in greater detail the colour switch shown in FIG. 1.

Referring to FIG. 1, in which only those parts of a spectrum analyser necessary for an understanding of the present invention are shown, a broad band signal from a signal source is received at an input terminal 1. Typically the broad band signal contains a very large number of different frequency components of varying amplitudes and the purpose of the spectrum analyser is to indicate which frequency components are present and the amplitude of these frequency components. The input signal is applied to a mixer 2 where it is mixed with a variable frequency obtained from a variable voltage controlled oscillator 3, which in operation is swept repetitively over a predetermined frequency band under the control of a frequency sweep generator 13. The signal obtained from the mixer 2 as a result of combining the two frequencies fed to it is passed via a narrow band filter 4 to a detector 5. The filter 4 is chosen to pass either the sum or the difference frequency produced by the mixer 2, and the detector 5, which has a linear response, produces a varying level d.c. signal proportional to the amplitude of the high frequency signal passed by the filter 4. This d.c. signal varies in amplitude as the variable oscillator 3 sweeps across its frequency band and it is sampled periodically by an analogue-to-digital converter 6, and the resulting digital words, which are representative of the instantaneous value of the d.c. signal, are routed to one of two random access memory (RAM) stores 7 or 8 by a store select switch 30. The location within the store is determined by a read-in address obtained via a further analogue-to-digital converter 40.

Because the frequency resolution of the spectrum analyser is dependent on the rate at which the variable oscillator 3 sweeps across its frequency bandwidth, and on the pass band of the filter 4, the selected store (which at the moment is assumed to be store 7) fills relatively slowly. The store 7 is subsequently read-out rapidly under the control of a reference oscillator 32, and a divider 33 and the contents of the store 7 passed via a digital-to-analogue converter 9 and a Z-axis amplifier 31 to a cathode ray tube display unit 11. The display 11 consists of a monochrome cathode ray tube in which an electron beam is arranged to produce a television like raster scanning pattern, but in this case the lines of the raster pattern scan from the bottom to the top of the display. The Z-axis amplifier control the intensity of the electron beam spot produced on the display screen.

The frequency divider 33 derives a line rate signal from the reference oscillator 32 and this is used by a line scan generator to deflect the electron beam in the Y-axis direction of the display 11 as the contents of the store 7 are read-out in synchronism under the control of a read-out address drive.

The Y-axis of the display 11 represents the amplitude of a particular frequency component and thus it is arranged that individual lines of the raster pattern represent the different frequencies and the point along the line at which an indicator is provided represents the amplitude of that frequency component. Conveniently the electron beam is arranged to produce a bright line on the display surface as it scans upwardly along a line, and is then extinguished at a point representative of the amplitude required. Alternatively, localised bright-up points can be produced on the line to indicate the required amplitude.

Since the field scan generator 12 which produces the X-axis direction deflection of the electron beam is in synchronism with the read-out address drive fed to the stores 7 and 8, the X-axis of the display 11 represents the variable frequency of the input signal applied at terminal 1.

Spectrum analysers are frequently used for the purpose of comparing two input signals and it is for this reason that two stores 7 and 8 are provided. The frequency components of one signal are held in store 7 and when subsequently a second input signal is applied to terminal 1, the digital words representative of its frequency components are entered into store 8. A colour switch 14 is arranged in front of the display 11 to enable the display information relating respectively to the stores 7 and 8 to be shown in different colours so as to enable an easy comparison between the two signals to be made. Where the two signals are very similar (as is often the case) and it is the small differences between them which are of importance, it is often extremely difficult if not impossible to distinguish reliably between the two signals when they are displayed in monochrome, that is to say, in varying shades of grey in a black and white picture, as it is only the difference in brightness which allows them to be distinguished easily.

The colour switch 14 is described subsequently in more detail with reference to FIG. 2, but briefly it consists of a layer of liquid crystal material and a pair of coloured polarised sheets, each sheet being a different colour and having its direction of polarisation at right angles to the other sheet. By the application of appropriate potentials to the colour switch one or other of the two colours or a combination of them can be seen by a viewer. The colour switch 14 is controlled by a colour select circuit 15, which is driven from the same source as is the field scan generator 12 so that it can be synchronised to the field rate of the display 11. Because liquid crystal material changes its optical state relatively slowly the colour switch 14 is split vertically into two sections which can be controlled electrically independently over lines 24 and 25.

The operation of the colour switch is as follows. It is assumed that the colour switch 14 has been controlled by the colour select circuit 15 to indicate a particular colour, typically red or blue and the contents of store 7 are then read-out and displayed in synchronism with the X-axis deflection of the display 11. When half the total number of line scans have been displayed, the left hand half of the colour switch is switched from, say, blue to red, but since the electron beam has moved on to scan the right hand half of the display 11, the colour red is not visible to a viewer at this time. By the time the field scan generator 12 has completed its sweep, the left hand half of the colour switch has completed its optical transition and is capable of displaying a pure red signal, and also at this time the switching process of the right hand half of the colour switch is initiated. At the beginning of the subsequent X-axis sweep, the contents of store 8 are routed to the Z-axis amplifier 31 so that a red picture is built up. This process is continued for as long as is required to produce two coloured displays one red and one blue. The correct timing of the optical transitions from one colour to another is determined by respective delay circuits 36 and 37 which are fed with a signal which is in synchronism with the field scan generator 12. The delay circuits 36 and 37 control the timing of the operation of respective drive circuits 38 and 39 which generate the signals necessary to turn the colour switch on and off.

It is often required to position a graticule or reference grid on the display screen 11 to enable a viewer to make measurements of the amplitude and frequency values displayed. For this purpose a graticule generator 16 is provided and since its signals are continuously displayed, it appears to a viewer as a combination of red and blue, i.e. magenta, thereby allowing it to be clearly distinguished from the spectral information which is red or blue. The output of the graticule generator 16 is combined with the output of the converter 9 at a summing circuit 35. In addition to the magenta graticule, magenta characters and numerals can be displayed in the same way if required. Additionally, data relating specifically to spectral information contained in one of the stores 7 and 8 can be displayed in the same colour, i.e. red or blue as required by arranging that it is switched into circuit on the appropriate field scan of the display.

The colour switch 14 is shown in greater detail in FIG. 2. It consists of a film 20 of liquid crystal material of the twisted nematic kind, the film having such a thickness and the material being such that the plane of polarisation of polarised light incident on one side of the film is rotated through 90° when the light emerges from the other side of the film. This optical condition exists in the absence of an electric field, but when an electric field is set up across the film, the plane of polarisation of incident light is no longer rotated, but pass through with its plane of polarisation unchanged.

One side of the film 20 is provided with a single transparent electrode 21 which is held at a fixed potential, and the other side is provided with two transparent electrodes 22 and 23 which each cover a respective half of the film, and these are connected to the colour select circuit 15 via conductors 24 and 25. A transparent polariser plate 26 is positioned between the film 20 and the surface of the display screen 11, and red and a blue polarised dichroic plates 27 and 28 are positioned on the outer side of the film 20. The polarisation axis of the red plate 27 is parallel to the polarisation axis of the polariser plate 26; the polarisation axis of the blue plate 28 is at right angles to these. The property of a coloured polarised dichroic plate is that when plane polarised white light is incident upon it with the plane of polarisation of light parallel to the polarisation axis of the plate, very little attenuation takes place and plane polarised white light emerges from the other side of the plate, but when the plane of polarisation of the incident white light is at right angles to the polarisation axis of the plate only light of the colour of the plate emerges.

Thus with reference to FIG. 2, if no potentials are applied across the liquid crystal film 20, the plane of polarisation of the polarised light passed by the polariser plate 26 is rotated through a right angle. As it is then at right angles to the polarisation axis of the red dichroic plate 27 only red light is passed by it, and this is allowed to pass through the blue dichroic plate 28 unaltered. Thus a red image is seen. When a potential is applied across the film 20, by a corresponding process only a blue image of the display 11 is seen. The two electrodes 22 and 23 are provided to allow for the relatively low switching speed of the liquid crystal material.

I claim:

1. A spectrum analyser including a monochrome cathode ray tube utilising a raster scanning pattern in which the lines of the raster are representative of different frequency components; a liquid crystal colour switch positioned immediately in front of the screen of the cathode ray tube and containing a thin film of liquid crystal material and two coloured polarised sheets, and selection means to selectively controlling the optical properties of the film so as to produce a display consisting of at least the two colours of said polarised sheets, and means for synchronising the operation of said selection means with the raster scanning pattern of the cathode ray tube.

2. A spectrum analyser as claimed in claim 1 and wherein there is provided at least two stores each containing data relating to the amplitude of frequency components, and means for causing data derived from one store to be displayed in one of said two colours, and for causing data derived from one of the other stores to be displayed in the other of said two colours.

3. A spectrum analyser as claimed in claim 2 and wherein means are provided for controlling separately two contiguous regions of the thin film of liquid crystal material.

4. A spectrum analyser as claimed in claim 3 and wherein the two contiguous regions pass light corresponding to equal areas of the screen of the cathode ray tube, with the line separating the two contiguous regions being substantially parallel to the line scanning direction of the raster scanning pattern.

* * * * *